US007039377B2

United States Patent
Yates

(10) Patent No.: US 7,039,377 B2
(45) Date of Patent: May 2, 2006

(54) SWITCHABLE GAIN AMPLIFIER

(75) Inventor: David L. Yates, San Clemente, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 396 days.

(21) Appl. No.: 10/171,891

(22) Filed: Jun. 14, 2002

(65) Prior Publication Data
US 2003/0232609 A1    Dec. 18, 2003

(51) Int. Cl.
    H04B 1/06    (2006.01)
(52) U.S. Cl. ............................... 455/232.1; 455/240.1; 455/241.1; 455/249.1
(58) Field of Classification Search ............ 455/232.1, 455/128.1, 241.1, 247.1, 245.2, 251.1, 253.1, 455/253.2, 240.1, 249.1, 234.1, 138, 245.1, 455/226.1–226.3, 234.2, 240.2, 241.2, 137, 455/129–134, 246.1, 303–308, 127, 250.1, 455/341, 13.4, 194.2, 296; 330/278, 279, 330/296, 124 R; 370/342, 332–333
    See application file for complete search history.

(56)    References Cited

U.S. PATENT DOCUMENTS

| 4,446,441 | A | * | 5/1984 | Fujibayashi ................. 330/149 |
| 5,191,301 | A | * | 3/1993 | Mullgrav, Jr. ................ 331/57 |
| 5,694,085 | A | * | 12/1997 | Walker ....................... 330/295 |
| 5,862,461 | A | * | 1/1999 | Yoshizawa et al. ....... 455/127.3 |
| 5,872,481 | A | * | 2/1999 | Sevic et al. .................... 330/51 |
| 5,896,062 | A | * | 4/1999 | Tiller et al. ................. 330/252 |
| 5,974,041 | A | * | 10/1999 | Kornfeld et al. ............ 370/342 |
| 5,999,559 | A | * | 12/1999 | Takaki ........................ 375/130 |
| 6,037,999 | A | * | 3/2000 | Kunishima .................. 348/731 |
| 6,043,721 | A |   | 3/2000 | Nagode et al. ............. 332/117 |
| 6,069,526 | A |   | 5/2000 | Ballantyne ................... 330/51 |
| 6,081,701 | A | * | 6/2000 | Norimatsu ............... 455/232.1 |
| 6,118,343 | A | * | 9/2000 | Winslow ..................... 330/295 |
| 6,163,328 | A | * | 12/2000 | Vannerson et al. ......... 347/128 |
| 6,172,559 | B1 |   | 1/2001 | Yamaguchi .................. 330/51 |
| 6,204,731 | B1 | * | 3/2001 | Jiang et al. .................. 330/310 |
| 6,297,694 | B1 | * | 10/2001 | Yamamoto .................... 330/51 |
| 6,300,828 | B1 | * | 10/2001 | McInnis ................. 330/124 R |
| 6,307,599 | B1 | * | 10/2001 | Komatsu ..................... 348/731 |
| 6,331,803 | B1 |   | 12/2001 | Zheng et al. ................ 330/254 |
| 6,345,176 | B1 | * | 2/2002 | Mattisson ................... 455/296 |
| 6,359,514 | B1 | * | 3/2002 | King et al. .................. 330/295 |
| 6,377,117 | B1 | * | 4/2002 | Oskowsky et al. ........... 330/51 |
| 6,384,586 | B1 | * | 5/2002 | Sugawara ................... 323/313 |
| 6,448,858 | B1 | * | 9/2002 | Helms et al. ............... 330/295 |
| 6,496,071 | B1 |   | 12/2002 | Xavier ....................... 330/283 |
| 6,563,364 | B1 | * | 5/2003 | Lee et al. .................... 327/337 |
| 6,639,463 | B1 | * | 10/2003 | Ghanadan et al. ...... 330/124 R |
| 6,710,662 | B1 | * | 3/2004 | Wang ......................... 330/295 |
| 6,804,501 | B1 | * | 10/2004 | Bradley et al. ............. 455/138 |
| 2002/0113656 | A1 | * | 8/2002 | Iwai ........................... 330/310 |
| 2003/0203727 | A1 | * | 10/2003 | Kluge et al. ............. 455/234.1 |
| 2004/0207739 | A1 | * | 10/2004 | Rossi ......................... 348/300 |

* cited by examiner

Primary Examiner—Pablo N. Tran

(57)    ABSTRACT

A switchable gain amplifier for use in mobile communications devices is provided, having a first amplifier stage having a first gain, a second amplifier stage connected in parallel with the first amplifier stage. The first and second amplifier stage have different gains and a gain controller, connected to the first amplifier stage and to the second amplifier stage, enables only one of the amplifier stages at a time.

21 Claims, 3 Drawing Sheets

SWITCHABLE GAIN AMPLIFIER

BACKGROUND OF THE INVENTION

1. Field of the Invention

This invention relates generally to the field of amplifiers and more particularly to switchable gain amplifiers.

2. Related Art

One of the most readily appreciated benefits of wireless communications is the mobility afforded the user of wireless communications. Mobile handsets having wireless telephone technology may be used in a variety of environments, for example, indoors, outside, or while travelling in an automobile or other vehicle.

The mobile use of a wireless communication devices, however, may result in large variations in signal strength of the radio frequency (RF) signals received by the wireless communication devices. Depending upon where the mobile handset is in relation to a basestation, and what obstacles may be in the transmission path, the received RF signal may be anywhere within a very wide range of signal strengths at the antenna. When the signal is relatively weak, more amplification in the radio is required. When the signal is strong, less amplification is required. Accordingly, wireless communications devices have been provided with low noise amplifiers (LNAs) for the RF signal that have a gain that can be adjusted in response to the strength of the received RF signal.

Some standards for wireless communications are more sensitive to variations in signal strength than others. For example, Code Division Multiple Access (CDMA) technology is especially sensitive to variations in RF signal strength. Thus, for a CDMA signal, high linearity amplification is highly desirable because it does not have a constant envelope. RF signal strength variations, however, may affect other formats of wireless communication to one degree or another, and the present invention is not necessarily limited to any particular communications format.

Previous solutions to providing a low noise amplifier (LNA) with adjustable gain include discrete attenuators or by simply switching off the LNA. For example, one known solution uses a discrete attenuator selectively switched in series with the input of the LNA. When the received RF signal is strong, the attenuator is switched in, and the incoming signal is attenuated before going to the LNA. When the received signal is relatively weak, the attenuator is switched out. A discrete attenuator, however, has the disadvantages of additional material costs, additional area required on the circuit board of the wireless device, and additional load on the input of the LNA even when the attenuator is switched out, thereby degrading noise performance.

Simply switching off the LNA also has a drawback. The RF signal output of the LNA is typically demodulated into baseband level signals for further processing. One advantageous use of a driver circuit to the downconverter is to use the driver circuit as a biasing current sink for the LNA. Switching off or bypassing the LNA when a strong signal is present would not allow the dual use of the driver for the downconverter as a current sink for the LNA.

SUMMARY

A switchable gain amplifier for use in mobile communications devices is achieved by using two amplifier stages connected in parallel. The first amplifier stage has a first gain and the second amplifier stage has a second gain which is less than the first gain. A gain controller coupled to the first amplifier stage and to the second amplifier stage enables one of the amplifier stages at a given time. The gain controller may include a gain control input, a current switch, and first and second bias current circuits responsive to the gain control input, and may include a first current enable output and a second current enable output to control the first bias current circuit and the second bias current circuit respectively. In one embodiment, the second gain may be about 0 dBs, and the first gain may exceed the second gain by at least 10 dBs.

In another embodiment of the switchable gain amplifier, bipolar transistor technology may be used. The first amplifier stage may include a first bipolar transistor with its collector, base, emitter, coupled to the corresponding elements of a second bipolar transistor comprising the second amplifier stage. In this embodiment, the gain controller may include a first bias current signal, connected to the base of the first transistor, and a second bias control signal connected to the base of the second transistor. The second emitter may be more heavily degenerated than the first emitter. In addition, the first base may be coupled to the second base by a DC blocking component and an impedance matching circuit.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessary to scale, emphasis instead being placed upon illustrating the principles of the invention. Moreover, in the figures, like reference numerals designate corresponding parts throughout the different views.

DETAILED DESCRIPTION

Figure 1:
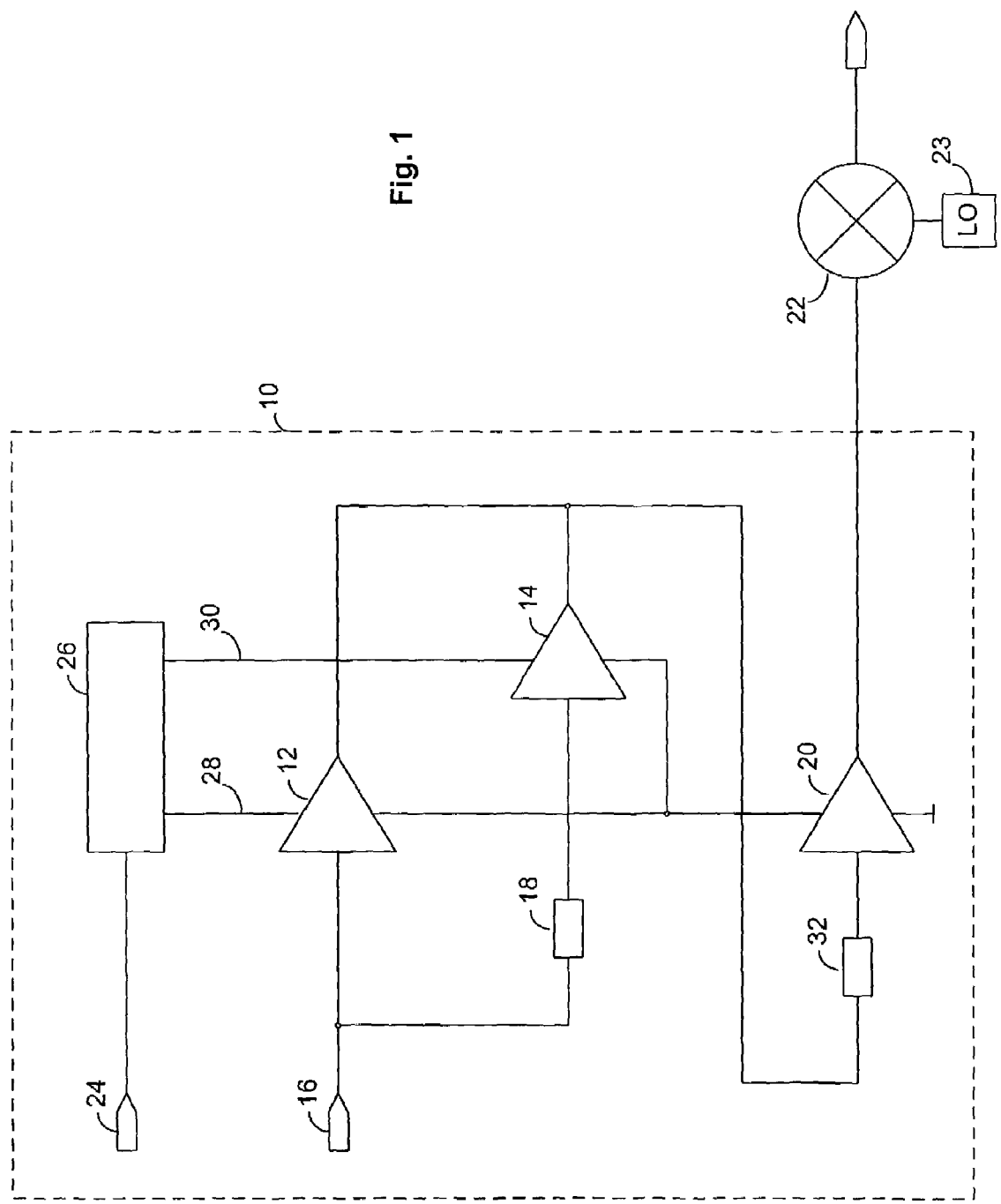
FIG. 1 is a circuit block diagram illustrating an example of a switchable gain amplifier.

FIG. 1 is a circuit block diagram illustrating an embodiment of a switchable gain low noise amplifier 10. The switchable gain low noise amplifier 10 comprises a first amplifier stage 12 and a second amplifier stage 14. The amplifier stages 12, 14 may be any amplifier with characteristics suitable for the desired application. The first amplifier stage 12 and second amplifier stage 14 are optimized to provide the desired power gain, noise figure and linearity, without requiring the load of a discrete attenuator. The first and second amplifier stages may be, but are not required to be, substantially physically identical. Differences between the first amplifier stage and the second amplifier stage may include power gain, linearity, and noise performance. In the embodiment illustrated in FIG. 1, the first amplifier stage 12 may be configured for a gain of about 13.5 dBs, and the second amplifier stage 14 may be configured for a gain of about 0 dBs, however, these gain values are for illustrative purposes and may be modified for any intended or desired application.

The first and second amplifier stages 12, 14 are connected in parallel in FIG. 1 with common inputs and outputs. An RF signal is preferably impedance-matched to the first amplifier stage 12 and is coupled from an RF input 16 to the first and second amplifier stages 12, 14. The second amplifier stage 14 may, however, have a different input impedance than the first amplifier stage 12, and when the first amplifier stage 12 is switched off and the second amplifier stage 14 is switched on, the input impedance may vary. Accordingly, in one embodiment, an impedance matching circuit 18 may be included between the first and second amplifier stages, so that when the amplifier is switched from high gain to low gain, any variation of input impedance for the low noise amplifier 10 is minimized.

The first amplifier stage 12 and the second amplifier stage 14 may in one embodiment share a common current sink 20. In one embodiment, the current sink 20 may perform the additional functions of the RF driver, which boosts the signal into a downconverter 22 having an associated local oscillator (LO) 23.

A gain control input 24 is connected to a gain controller 26. The gain controller 26 provides a first gain enable signal 28 to the first amplifier stage 12 and a second gain enable signal 30 to the second amplifier stage 14. Thus, the gain controller 26 may be any control circuit, for example, a digital or analog control circuit, which provides suitable enable signals to the amplifier stage 12, 14 in response to a gain control input. For example, when an applied voltage at the gain control input 24 is low, gain controller 26 may apply the first gain enable signal 28 to the first amplifier stage 12 and disable the second gain enable signal 30 to the second amplifier stage 14. In this state, the first amplifier stage 12 is enabled and the second amplifier stage 14 is disabled. Accordingly, when the voltage at the gain control input 24 is low, the overall gain of the low noise amplifier 10 is the gain of the first amplifier stage 12. In this example, when an applied voltage at the gain control input 24 is high, gain controller 26 disables the first gain enable signal 28 to the first amplifier stage 12, and applies the second gain enable signal 30 to the second amplifier stage 14. In this state, the first amplifier stage 12 is disabled and the second amplifier stage 14 is enabled. Accordingly, when the voltage at the gain control input 24 is high, the overall gain of the low noise amplifier 10 is the gain of the second amplifier stage 14.

The output of the first amplifier stage 12 and the second amplifier stage 14 is coupled, in the illustrated embodiment of FIG. 1, to a SAW (Surface Acoustic Wave) filter 32. SAW filters are useful because they generally have very narrow bandwidth and have a sharp roll off outside the intended bandwidth. The SAW filter 32 passes the desired radio frequency signal while greatly attenuating the image frequency of a signal. Any other filter type having characteristics suitable for the application may be used. The output of the SAW filter 32 is applied in the embodiment of FIG. 1 to the base of current sink 20. In the embodiment illustrated in FIG. 1, current sink 20 may also function as the RF driver for the downconverter 22. The collector of current sink 20 is coupled to downconverter 22.

Figure 2:
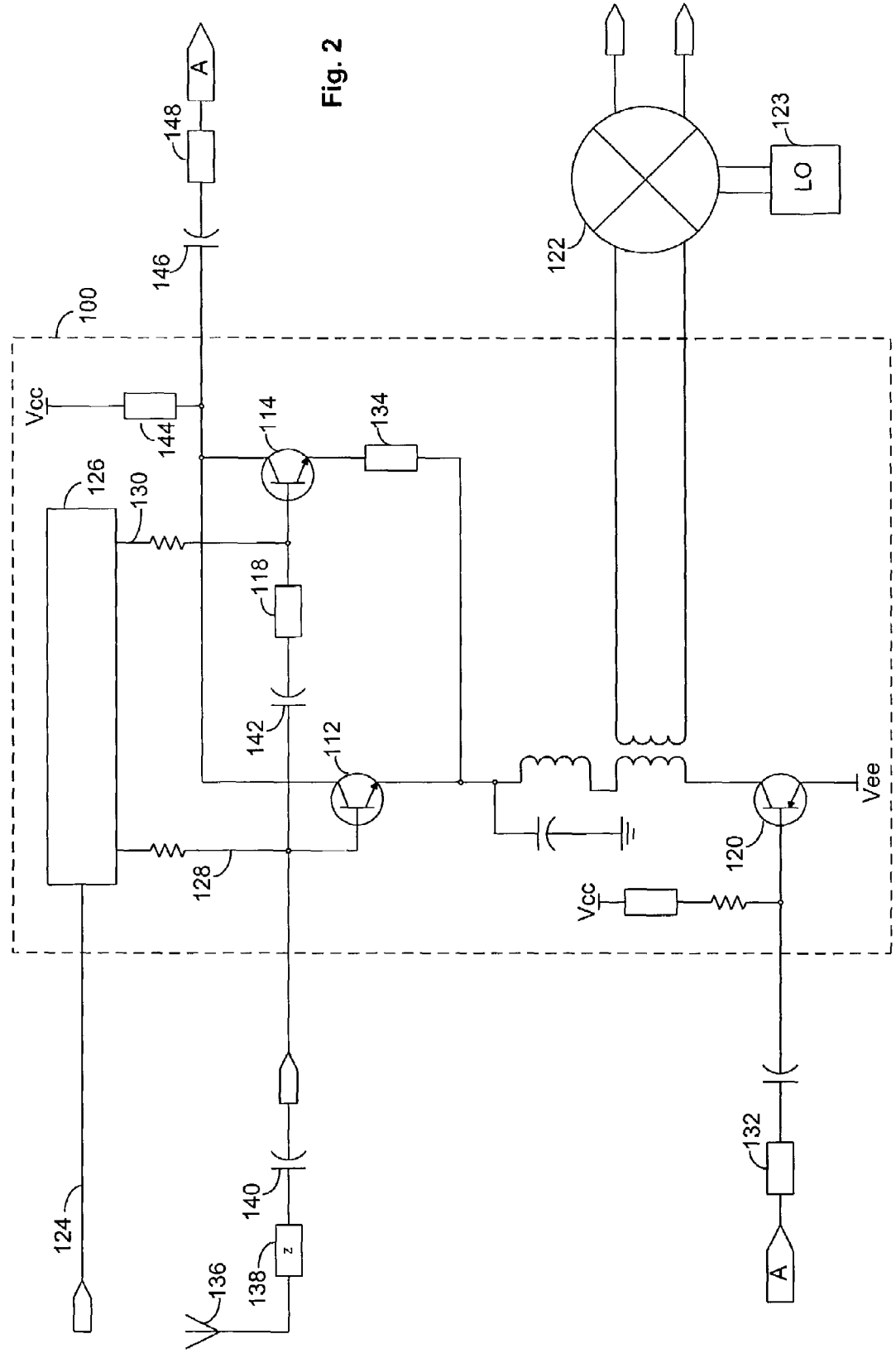
FIG. 2 is a schematic circuit diagram illustrating an example of a switchable gain amplifier.

FIG. 2 is an illustration of another embodiment of an implementation of a switchable gain low noise amplifier 100. This embodiment employs an integrated circuit using bipolar fabrication technology. Generally, bipolar circuits are preferred for low noise amplifiers which may operate at the frequencies used in wireless communications. However, the invention is not necessarily limited to integrated circuit embodiments or bipolar fabrication techniques. For example, BiCMOS, CMOS technologies and non-integrated technologies may also be used in wireless communications.

In the embodiment of the switchable gain low noise amplifier 100 illustrated in FIG. 2, a first amplifier stage 112 and a second amplifier stage 114 are bipolar transistor amplifier stages. The first and second bipolar transistor amplifier stages may be, but are not required to be, substantially physically identical. Differences may include power gain, linearity, and noise performance. In the embodiment illustrated in FIG. 2, the first amplifier stage 112 is configured for a gain of 13.5 dBs, and the second amplifier stage 114 is configured for a gain of 0 dBs. The reduction of gain for the second amplifier stage may be accomplished, for example, by including extra inductance on the emitter portion of the second amplifier stage 114. The inductance may be referred to as a degeneration inductor 134. For clarity, degeneration inductor 134 is illustrated as an inductor in series with the collector of the second stage 114. Other techniques known in the art may also be used to provide the desired degeneration. The second amplifier stage 114 may also be configured for high linearity. A higher linearity for the second amplifier stage 114 is desirable because the second stage generally handles a stronger RF signal than the first amplifier stage. The emitter of the second amplifier stage 114 may in one embodiment be degenerated sufficiently for a third order intercept point of +15 dBm. The first amplifier stage 112 may, for example, have a third order intercept point of +7–8 dBm. The second amplifier stage 114 may also have a higher noise figure than the first amplifier stage.

The first and second amplifier stages 112, 114 are connected in parallel with common inputs and outputs. In the illustrated embodiment, using bipolar technology, the collector of the first amplifier stage 112 is connected to the collector of the second amplifier stage 114, and the emitter of the first amplifier stage 112 is coupled to the emitter of the second amplifier stage 114. In the embodiment of FIG. 2, the base of the first amplifier stage 112 is coupled to the base of the second amplifier stage 114 via a DC blocking capacitor 142 and an impedance matching circuit 118. Of course, when different fabrication technology is used, such as CMOS or BiCMOS, the first and second amplifier stages may or may not have "bases," "collectors" or "emitters." For example, field effect transistor amplifiers may have "gates," "drains," and "sources." It is contemplated that the present invention may be fabricated in such alternative fabrication technologies making appropriate adjustments known to those having skill in the art. Also, while a single-ended circuit is illustrated for clarity, other configurations including differential amplifier stages are contemplated as well.

An RF signal is received by an antenna 136 and is coupled in the embodiment illustrated in FIG. 2 to the bases of first amplifier stage 112 and second amplifier stage 114 via an impedance matching circuit 138 and a DC blocking capacitor 140. The impedance matching circuit 138 and DC blocking capacitor 140 may be external components selected to generally match the impedance of the first amplifier stage 112. However, the second amplifier stage 114 may have a different input impedance than the first amplifier stage 112, and when the first amplifier stage 112 is switched off and the second amplifier stage 114 is switched on, the input impedance may vary. Accordingly, the impedance matching circuit 118 may be included between the first and second amplifier stages, so that when the amplifier is switched from high gain to low gain, any variation of input impedance for the low noise amplifier 100 is minimized.

The emitters of the first amplifier stage 112 and the second amplifier stage 114 share a common current sink 120. In the illustrated embodiment, the current sink 120 may perform the additional functions of the RF driver, which boosts the signal into a downconverter 122 having an associated local oscillator (LO) 123.

A gain control input 124 is coupled to gain controller 126 as shown in FIG. 2. The gain controller 126 provides a first gain enable signal 128 in the form of a bias current to the base of the first amplifier stage 112 and a second gain enable signal 130 in the form of a bias current to the base of the second amplifier stage 114. The DC blocking capacitor 118 allows for the separate bias current signals.

In the embodiment illustrated in FIG. 2, a common output load 144 is shared by the collectors first amplifier stage 112 and the second amplifier stage 114. The amplified signal present at the common output of the first and second amplifier stages is coupled through a DC blocking capacitor 146 and an impedance matching circuit 148 to a SAW filter 132. The output of the SAW filter 132 is applied to the base of current sink 120. The collector of current sink 120 is coupled to downconverter 122.

Figure 3:
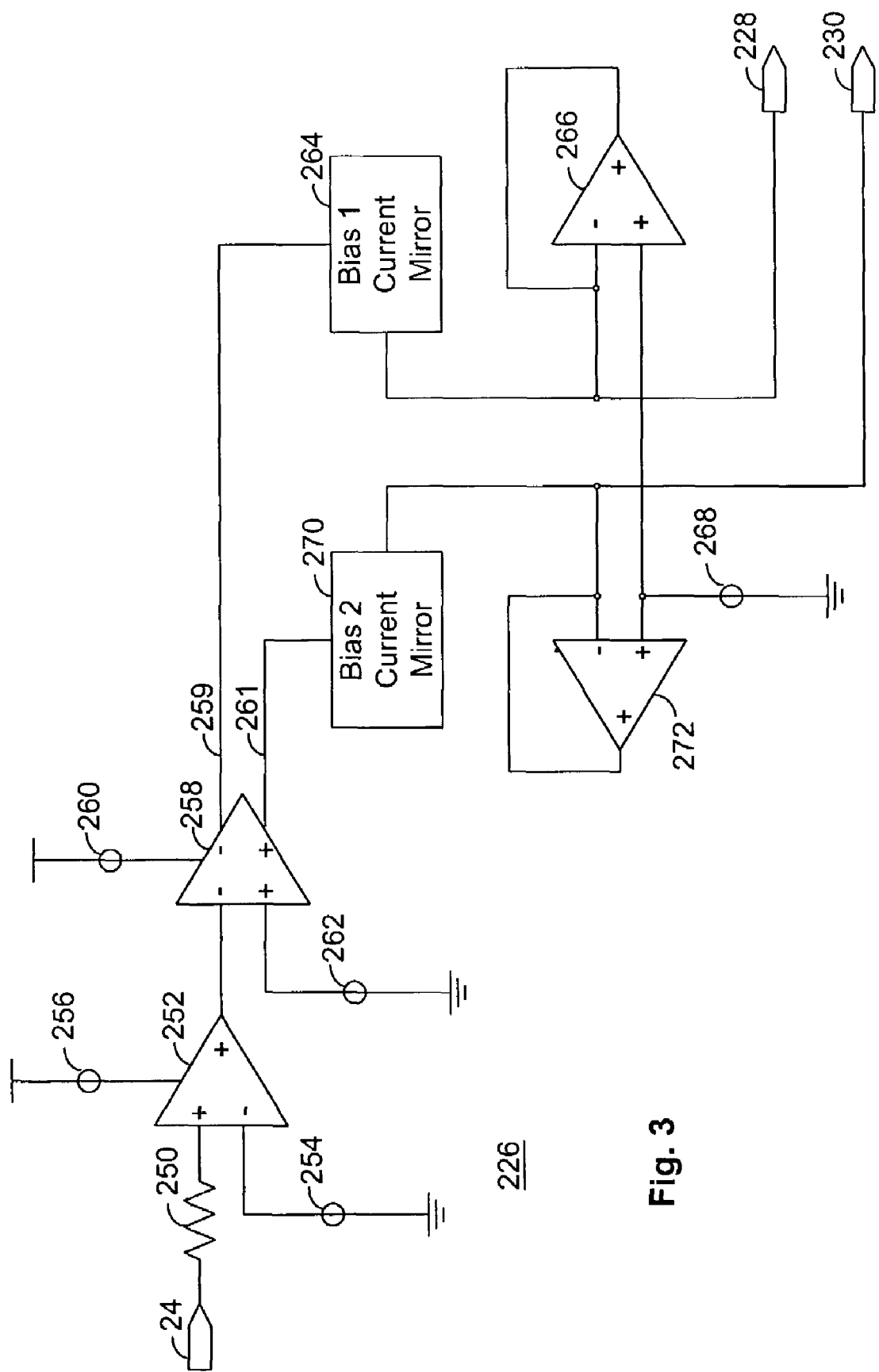
FIG. 3 is a schematic circuit diagram illustrating an example of a gain control circuit.

Referring to FIG. 3, a simplified schematic diagram of another embodiment of a gain controller 226 is illustrated. In the illustrated embodiment of FIG. 3, the gain control input 24 is coupled through resistor 250 to a control input of a differential amplifier 252. A reference input of the differential amplifier 252 is connected to a voltage reference 254. The voltage reference 254 may, for example, be configured to a voltage approximately half way between the high and low voltages of gain control input 24. In the illustrated embodiment, voltage reference 254 may be approximately half of the supply voltage. The differential amplifier 252 is configured so that the output follows the input. In the illustrated embodiment, a non-inverting input is the control input, an inverting input is the reference input, and a non-inverting output is the output. A current source 256, which in one embodiment may be PTAT (proportional to absolute temperature) compensated, supplies current to differential amplifier 252. PTAT compensation helps maintain a generally constant bias current, and therefore gain, for the low noise amplifier over a very wide temperature range, e.g., –30 degrees C. to 80 degrees C.

In the embodiment of FIG. 3, the output of differential amplifier 252 is connected to a control input of a current switch 258. A current source 260 provides current to the current switch 258, and a voltage reference 262 provides a reference voltage to a reference input of the current switch 258. The current switch 258 may be, for example, a differential PNP current switch. Depending on the state of control input relative to the reference input, the current switch 258 will switch current from the current source 260 to either a first output 259 or to a second output 261. In the illustrated embodiment, an inverting input is the control input, a non-inverting input is the reference voltage, an inverting output is the first output 259 and a non-inverting output is the second output 261.

The first output 259 of current switch 258 is connected to a first bias current mirror 264 in the embodiment of FIG. 3. The output of first current mirror 264 is the first bias current signal 228. The voltage of first bias current signal 228 is stabilized by voltage follower 266, which follows bias voltage reference 268. To maintain a stable bias voltage for the first amplifier stage (for example, stage 112 in FIG. 2), the bias voltage reference 268 may be, for example, PTAT referenced from separate bias cell to compensate for temperature variations.

The second output 261 of the current switch 258 is connected to a second bias current mirror 270 in the embodiment illustrated in FIG. 3. The output of second current mirror 270 is the second bias current signal 230. The voltage of second bias current signal 230 is stabilized by voltage follower 272, which follows bias voltage reference 268.

In operation, when gain control input 24 is low (e.g., lower than voltage reference 254, such as ground), first bias current mirror 264 is enabled and second bias current mirror 270 is disabled. Accordingly, a first gain enable signal is generated at an output 228 to apply a bias current to the first amplifier stage (e.g., signal 128 to the base of stage 112 in FIG. 2), while a second gain enable signal output 230 does not apply any significant bias current to the second amplifier stage (e.g., signal 130 to the base of stage 114 in FIG. 2). Thus, only the first amplifier stage is active and the low noise amplifier is in a high gain state. When gain control input 24 is high (e.g., higher than voltage reference 254, such as supply voltage), first bias current mirror 264 is disabled and second bias current mirror 270 is enabled. Accordingly, no significant bias current is applied through the first gain enable signal output 228 to the first amplifier stage, while second gain enable signal output 230 applies a bias current to the second amplifier stage. Thus, only the second amplifier stage (e.g., 14 or 114 in FIGS. 1 and 2) is active and the low noise amplifier is in a low gain state.

While various embodiments of the invention have been described, it will be apparent to those of ordinary skill in the art that many more embodiments and implementations are possible that are within the scope of the invention.

What is claimed is:

1. A switchable gain amplifier comprising:
   a) a first place amplifier stage having a first gain;
   b) a second amplifier stage connected in parallel with the first amplifier stage, the second amplifier stage having a second gain, wherein the first gain is greater than the second gain; and
   c) a gain controller, connected to the first amplifier stage and to the second amplifier stage, the gain controller enabling one of either the first amplifier stage or the second amplifier stage at a time, wherein the gain controller further comprises:
   a) a gain control input;
   b) a current switch, responsive to the gain control input, having a first current enable output and a second current enable output;
   c) a first bias current circuit, responsive to the first current enable output, the first bias current circuit generating the first bias current signal; and
   d) a second bias current circuit, responsive to the second current enable output, the second bias current circuit generating the second bias current signal.

2. The switchable gain amplifier of claim 1, wherein the first amplification stage and the second amplification stage share a common current sink.

3. The switchable gain amplifier of claim 2 wherein the current sink also functions as an RF driver.

4. The switchable gain amplifier of claim 1, wherein an impedance matching circuit is coupled between the first amplifier stage and the second amplifier stage.

5. The switchable gain amplifier of claim 1, wherein the second amplifier stage has higher linearity than the first stage amplifier.

6. The switchable gain amplifier of claim 1, wherein the second amplifier stage has a higher noise figure than the first amplifier stage.

7. The switchable gain amplifier of claim 1, wherein the first and second amplifier stages further comprise differential amplifiers.

8. The switchable gain amplifier of claim 1, wherein a filter is coupled to the first amplifier stage and the second amplifier stage.

9. The switchable gain amplifier of claim 1, wherein:
a) the first amplifier stage further comprises a first bipolar transistor having a first collector, a first base, and a first emitter;
b) the second amplifier stage further comprises a second bipolar transistor having a second collector, a second base, and an second emitter; and
c) the gain controller further comprises a first bias current signal, connected to the first base, and a second bias control signal connected to the second base;
wherein the first collector is coupled to the second collector, the first emitter is coupled to the second emitter, and the first base is coupled to the second base.

10. The switchable gain amplifier of claim 9, wherein the first base is coupled to the second base by a DC blocking component and an impedance matching circuit.

11. The switchable gain amplifier of claim 9, wherein the emitter of the second bipolar transistor further comprises a degeneration inductor, the second bipolar transistor otherwise being substantially physically identical to the first bipolar transistor.

12. The switchable gain amplifier of claim 1, wherein the gain controller further comprises a temperature compensated bias voltage reference coupled to the first bias circuit and to the second bias current circuit.

13. A switchable gain amplifier, for use in mobile communications devices, comprising:
a) a first bipolar transistor having a first collector, a first base, and a first emitter and providing a first gain;
b) a second bipolar transistor having a second collector, a second base, and a second emitter and providing a second gain different from the first gain; and
c) a gain controller having a first bias current signal connected to the first base and a second bias current signal connected to the second base, the gain controller applying either the first bias current signal or the second bias current signal at a time, wherein the gain controller further comprises:
a) a gain control input;
b) a current switch, responsive to the gain control input, having a first current enable output and a second current enable output;
c) a first bias current circuit, responsive to the first current enable output, the first bias current circuit generating the first bias current signal; and
d) a second bias current circuit, responsive to the second current enable output, the second bias current circuit generating the second bias current signal.

14. The switchable gain amplifier of claim 13, wherein the first gain exceeds the second gain by at least 10 dBs.

15. The switchable gain amplifier of claim 13, wherein the first base is coupled to the second base by a DC blocking capacitor and an impedance matching circuit.

16. In a radio receiver for use in mobile communications devices, having an antenna, a radio frequency driver and a downconverter, a switchable gain low noise amplifier comprising:
a) a first amplifier stage having a first gain, the first amplifier stage comprising a first bipolar transistor having a first collector, a first base, and a first emitter;
b) a second amplifier stage having a second gain, the second amplifier stage further comprising a second bipolar transistor having a second collector, a second base coupled to the first base and the antenna, and a second emitter;
c) a gain controller having a first bias current signal connected to the first base and a second bias control signal connected to the second base, the gain controller enabling one of either the first amplifier stage or the second amplifier stage at a time; and
d) a bandpass filter coupled to the first and second collectors, the band pass filter coupled to the radio frequency driver, and the radio frequency driver coupled to the downconverter.

17. The low noise amplifier of claim 16, wherein the radio frequency driver is further coupled to the first and second emitters, providing a current sink circuit for the first amplifier stage and for the second amplifier stage.

18. A switchable gain amplifier, for use in mobile communications devices, comprising:
a) a first means for amplifying having a first gain;
b) a second means for amplifying connected in parallel with the first means for amplifying, the second means for amplifying having a second gain, wherein the first gain is greater than the second gain; and
c) a means for enabling either the first means for amplifying or the second means for amplifying at a time, the means for enabling connected to the first means for amplifying and to the second means for amplifying, wherein the means for enabling further comprises:
a) a gain control input;
b) a means for switching current, responsive to the gain control input, having a first current enable output and a second current enable output;
c) a first means for generating a bias current circuit, responsive to the first current enable output and coupled to the first amplifier stage; and
d) a second means for generating a bias current, responsive to the second current enable output and coupled to the second amplifier stage.

19. The switchable gain amplifier of claim 18, wherein: the first means for amplifying has a first signal input, a first signal output, and a first control input.

20. The switchable gain amplifier of claim 19, wherein the a second signal input coupled to the first signal input by a DC blocking means and an impedance matching means.

21. In a radio receiver for use in a mobile communications device having an antenna, a radio frequency driver, and a downconverter, a switchable gain low noise amplifier comprising:
a) a first means for amplifying having a first gain, a first signal input coupled to the antenna, a first signal output, and a first control input;
b) a second means for amplifying connected in parallel with the first means for amplifying, the second means for amplifying having a second gain, a second signal input coupled to the first signal input, a second signal output coupled to the first signal out, and a second control input, wherein the first gain is greater than the second gain;
c) a means for enabling either the first means for amplifying or the second means for amplifying at a time, the means for enabling having a first control output coupled to the first control input and a second control output coupled to the second control input; and
d) a means for bandpass filtering coupled to the first and second signal outputs; wherein the means or bandpass filtering is coupled to the radio frequency driver, and the radio frequency driver is coupled to the downconverter.

* * * * *